United States Patent
He et al.

(10) Patent No.: US 10,210,834 B2
(45) Date of Patent: Feb. 19, 2019

(54) GATE INTEGRATED DRIVING CIRCUIT AND DRIVING METHOD THEREOF, AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Min He, Beijing (CN); Haixia Xu, Beijing (CN); Dongxu Han, Beijing (CN); Meng Li, Beijing (CN)

(73) Assignees: BOE TECHNOLOGY GROUP CO., LTD., Beijing (CN); Hefei Xinsheng Optoelectronics Technology Co., Ltd., Hefei, Anhui (CN)

( * ) Notice: Subject to any disclaimer, the term of this patent is extended or adjusted under 35 U.S.C. 154(b) by 0 days.

(21) Appl. No.: 15/573,948

(22) PCT Filed: May 15, 2017

(86) PCT No.: PCT/CN2017/084330
§ 371 (c)(1),
(2) Date: Nov. 14, 2017

(87) PCT Pub. No.: WO2018/058964
PCT Pub. Date: Apr. 5, 2018

(65) Prior Publication Data
US 2018/0293952 A1    Oct. 11, 2018

(30) Foreign Application Priority Data
Sep. 28, 2016  (CN) .......................... 2016 1 0860672

(51) Int. Cl.
*G11C 19/00* (2006.01)
*G09G 3/36* (2006.01)
(Continued)

(52) U.S. Cl.
CPC .......... *G09G 3/3677* (2013.01); *G11C 19/28* (2013.01); *H03K 17/284* (2013.01);
(Continued)

(58) Field of Classification Search
None
See application file for complete search history.

(56) References Cited

U.S. PATENT DOCUMENTS

| 2011/0285688 A1 | 11/2011 | Miyake et al. |
| 2016/0018844 A1* | 1/2016 | Sasaki .................... G11C 19/28 |
| | | 713/600 |

(Continued)

FOREIGN PATENT DOCUMENTS

| CN | 104616616 A | 5/2015 |
| CN | 105096889 A | 11/2015 |

(Continued)

OTHER PUBLICATIONS

International Search Report dated Aug. 16, 2017, issued in counterpart International Application No. PCT/CN2017/084330 (5 pages).
Written Opinion of the International Seaching Authority dated Aug. 16, 2017, issued in counterpart International Application No. PCT/CN2017/084330 (4 pages).

*Primary Examiner* — Tuan T Lam
(74) *Attorney, Agent, or Firm* — Westerman, Hattori, Daniels & Adrian, LLP

(57) ABSTRACT

A gate integrated driving circuit for a display panel. The gate integrated driving circuit may comprise N reset circuits. For each of the N reset circuits, a first terminal thereof may be coupled to a reference signal terminal, a second terminal thereof may be coupled to signal output terminals of a set of input and output circuits respectively, a third terminal thereof may be coupled to control terminals of driving circuits of the set of input and output circuits respectively, and a fourth terminal thereof may be coupled to a clock (Continued)

signal terminal coupled to input terminals of the driving circuits of the set of input and output circuits respectively. N may be an integer of at least 3. The set of input and output circuits may contain two or more input and output circuits.

20 Claims, 5 Drawing Sheets

(51) Int. Cl.
 *G11C 19/28* (2006.01)
 *H03K 17/284* (2006.01)

(52) U.S. Cl.
 CPC . *G09G 2230/00* (2013.01); *G09G 2300/0408* (2013.01); *G09G 2310/08* (2013.01)

(56) References Cited

U.S. PATENT DOCUMENTS

| | | | |
|---|---|---|---|
| 2016/0372023 | A1 | 12/2016 | Zhang et al. |
| 2017/0153742 | A1* | 6/2017 | Pang ..................... G06F 3/0416 |
| 2017/0193888 | A1* | 7/2017 | Moon ...................... G09G 3/20 |

FOREIGN PATENT DOCUMENTS

| | | |
|---|---|---|
| CN | 105096902 A | 11/2015 |
| CN | 105245089 A | 1/2016 |
| JP | 2010-86640 A | 4/2010 |

\* cited by examiner

GATE INTEGRATED DRIVING CIRCUIT AND DRIVING METHOD THEREOF, AND DISPLAY APPARATUS

CROSS-REFERENCE TO RELATED APPLICATIONS

This application claims the benefit of the filing date of Chinese Patent Application No. 201610860672.9 filed on Sep. 28, 2016, the disclosure of which is hereby incorporated by reference.

TECHNICAL FIELD

This invention relates to a display technology, and more particularly, to an output reset circuit, a gate integrated driving circuit and a driving method thereof, and a display apparatus.

BACKGROUND

GOA (Gate on array) is a technology integrating a gate-integrated driving circuit onto a thin film transistor (TFT) substrate, which supplies a gate driving signal to a gate of each of thin film transistors in a pixel region. Therefore, comparing to conventional driving technology of liquid crystal display panels, GOA reduces bonding area and fan-out wiring space of the gate driving circuit, which not only saves materials and footprint of the driving circuit but also reduces fabricating steps and cost of products.

In a conventional gate integrated driving circuit, each stage of the input and output circuit usually includes a plurality of circuits having different functions, such as input circuits, output circuits, and driving circuits. At the same time, in order to reduce interference of noise on the driving circuit in a non-operation period, a reset circuit is usually provided to eliminate the noise. Therefore, in order to ensure stability of the driving circuit signal, each input and output circuit is usually provided with a reset circuit, thereby significantly increasing occupied area of the gate integrated driving circuit. In addition, structure and fabricating process of the gate integrated driving circuit become more complex, thereby further increasing cost of products.

BRIEF SUMMARY

Accordingly one example of the present disclosure is a gate integrated driving circuit. The gate integrated driving circuit may comprise N reset circuits. For each of the N reset circuits, a first terminal thereof may be coupled to a reference signal terminal, a second terminal thereof may be coupled to signal output terminals of a set of input and output circuits respectively, a third terminal thereof may be coupled to control terminals of driving circuits of the set of the input and output circuits respectively, and a fourth terminal thereof may be coupled to a clock signal terminal coupled to input terminals of the driving circuits of the set of the input and output circuits respectively. N may be an integer of at least 3. The set of input and output circuits may contain two or more input and output circuits.

The gate integrated driving circuit may also comprise N clock signal terminals. The N reset circuits may comprise a m-th reset circuit. A second terminal of the m-th reset circuit may be coupled to signal output terminals of a set of input and output circuits of the (N*k+m)-th stages respectively. A third terminal of the m-th reset circuit may be coupled to control terminals of driving circuits of the set of the input and output circuits of the (N*k+m)-th stages respectively. A fourth terminal of the m-th reset circuit may be coupled to the m-th clock signal terminal which is coupled to input terminals of the driving circuits of the set of input and output circuits of the (N*k+m)-th stages respectively. k represents a series of continuous integers from 0 to x and m is an integer within a range from 1 to N.

Each of the N reset circuit may be configured to electrically connect the reference signal terminal to the signal output terminals of the set of input and output circuits respectively under a control of the clock signal terminal coupled to the input terminals of the driving circuits of the set of input and output circuits respectively.

Each of the N clock signal terminals coupled to input terminals of driving circuits of a set of input and output circuits respectively may be inputted a clock signal, and different clock signal terminals may be inputted with different clock signals respectively. Furthermore, there may be overlapping timing between each of the two clock signals, a time-delay may be provided between each pair of adjacent clock signals sequentially from the first clock signal inputted at the first clock signal terminal to the N-th clock signal inputted at the N-th clock signal terminal. The time-delay may equal to 1/N of one period of a former clock signal of the pair of adjacent clock signals.

Each of the input and output circuits may comprise an input circuit and a driving circuit. A control terminal of the input circuit may be coupled to a first clock signal terminal, an input terminal thereof may be coupled to a signal input terminal and an output terminal thereof may be coupled to a control terminal of the driving circuit. The input circuit may be configured to transmit an effective pulse signal inputted from the signal input terminal to the control terminal of the driving circuit under a control of a first clock signal of the first clock signal terminal.

An input terminal of the driving circuit may be coupled to a second clock signal terminal, an output terminal thereof may be coupled to a signal output terminal. The driving circuit may be configured to output a second clock signal inputted from the second clock signal terminal to the signal output terminal under a control of the effective pulse signal. An effective pulse of the first clock signal may be earlier than an effective pulse of the second clock signal during a repetition period.

The input circuit may comprise a third thin film transistor. A gate of the third thin film transistor may be coupled to the first clock signal terminal, a source thereof may be coupled to the signal input terminal, and a drain thereof may be coupled to the control terminal of the driving circuit.

The driving circuit may comprise a fourth thin film transistor and a second capacitor. A gate of the fourth thin film transistor may be coupled to the output terminal of the input circuit, a source thereof may be coupled to the second clock signal terminal, and a drain thereof may be coupled to the signal output terminal. The second capacitor may be coupled between the gate and the drain of the fourth thin film transistor. N may be 3.

Each of the N reset circuits may include a pull-down circuit, a potential holding circuit, and a pull-down control circuit. A control terminal of the pull-down circuit may be coupled to a first node, an input terminal thereof may be coupled to the reference signal terminal, an output terminal thereof may be coupled to a signal output terminal of an input and output circuit. The pull-down circuit may be configured to electrically connect the reference signal terminal to the signal output terminal of the input and output circuit under a control of a potential of the first node.

A first terminal of the potential control circuit may be coupled to the first node and a second terminal thereof may be coupled to a clock signal terminal.

A control terminal of the pull-down control circuit may be coupled to a control terminal of a driving circuit of the input and output circuit, an input terminal thereof may be coupled to the reference signal terminal, an output terminal thereof may be coupled to the first node. The pull-down control circuit may be configured to control the potential of the first node through the clock signal terminal coupled to the potential control circuit and the reference signal terminal under a control of a potential of the control terminal of the driving circuit of the input and output circuit.

The pull-down circuit may comprise a first thin film transistor. A gate of the first thin film transistor may be coupled to the first node, a source thereof may be coupled to the signal output terminal of the input and output circuit, and a drain thereof may be coupled to the reference signal terminal.

The potential holding circuit may comprise a first capacitor. A first terminal of the first capacitor may be coupled to the first node and a second terminal thereof may be coupled to the clock signal terminal.

The pull-down control circuit may comprise a second thin film transistor. A gate of the second thin film transistor may be coupled to the control terminal of the driving circuit in the input and output circuit, a source thereof may be coupled to the reference signal terminal, and a drain thereof may be coupled to the first node.

Except an input and output circuit of last stage, a signal output terminal of each of remaining input and output circuits is configured to input a valid pulse signal to a signal input terminal of an input and output circuit of next stage.

Another example of the present disclosure is a display apparatus comprising the gate integrated driving circuit according to one embodiment of the present disclosure.

Another example of the present disclosure is a driving method of the gate integrated driving circuit according to one embodiment of the present disclosure, wherein N=3. The driving method may comprise, in the first phase, applying an effective pulse signal to the first clock signal terminal; in the second phase, applying an effective pulse signal to the second clock signal terminal; in the third phase, stopping the effective pulse signal applied to the first clock signal terminal; in the fourth phase, applying an effective pulse signal to the third clock signal terminal; in the fifth phase stopping the effective pulse signal applied to the second clock signal terminal; and in the sixth phase, applying an effective pulse signal to the first clock sign terminal.

In the first phase, an effective pulse signal inputted from the first clock signal terminal may be outputted to the signal output terminal of the first set of input and output circuits under a control of the control terminal of the driving circuit in the first set of input and output circuits, the potential of the first node may be pulled low, the gate driving scan signal outputted from the first set of input and output circuit signal outputs may be outputted to the control terminal of the driving circuit in the second set of input and output circuits coupled to the first set of input and output circuit signal outputs, and, meanwhile, the potential control circuit of the reset circuit coupled to signal output terminal of the first set of input and output circuits may be charged.

In the second phase, an effective pulse signal may be outputted to the signal output terminal of the second set of input and output circuits under a control of the control terminal of the driving circuit of the second set of input and output circuits, the potential of the second node may be pulled low, the gate driving scan signal outputted from signal output terminals of the second set of input and output circuit may be outputted to the control terminal of the driving circuit of the third set of input and output circuits which is coupled to the second set of the input and output circuit signal output terminals, and the potential control circuit of the reset circuit coupled to signal output terminals of the first set of input and output circuits may be charged.

In the third phase, the signal output terminals of the first set of the input and output circuits may stop generating output, and the input circuits of the second set of the input and output circuits may be in the off state.

in the fourth stage, an effective pulse signal may be outputted to the signal output terminal of the third input and output circuit under the control of the terminal of the driving circuit of the third set of the input and output circuits, the potential of the third node may be pulled low, the gate driving scan signal outputted from the signal output terminal of the third group input and output circuits may be outputted to the control terminal of the driving module in the first set of the input and output circuits coupled to the signal output terminal of the third input and output circuit, and the potential control module of the reset circuit coupled to the signal output terminal of the third set of the input and output circuits may be charged.

In the fifth stage, the signal outputs of the second set of the input and output circuits may stop generating output, and the input circuit of the third set of the input and output circuits may be in the off state.

In the sixth stage, the reference signal of the reference signal terminal may be outputted to the signal output terminal of the first set of fee input and output circuits.

The driving method may further comprise, in the seventh phase, stopping the effective pulse signal applied to the third clock signal terminal; in the eighth phase, applying an effective pulse signal to the second clock signal terminal; in the ninth phase, stopping the effective pulse signal applied to the first clock signal terminal; and in the tenth phase, applying an effective pulse signal to the third clock signal terminal.

In the seventh phase, output terminals of the third set of input and output circuits may stop generating output, and the input circuit of the first set of input and output circuits may be in the off state. In the eighth phase, the reference signal of the reference signal terminal may be outputted to the signal output terminal of the second input and output circuit. In the ninth phase, the pull-down circuit of the reset circuit coupled to the first set of input and output circuit signal output terminals may be in the off state. In the tenth phase, the reference signal of the reference signal terminal may be output to the signal output terminal of the third input and output circuit.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
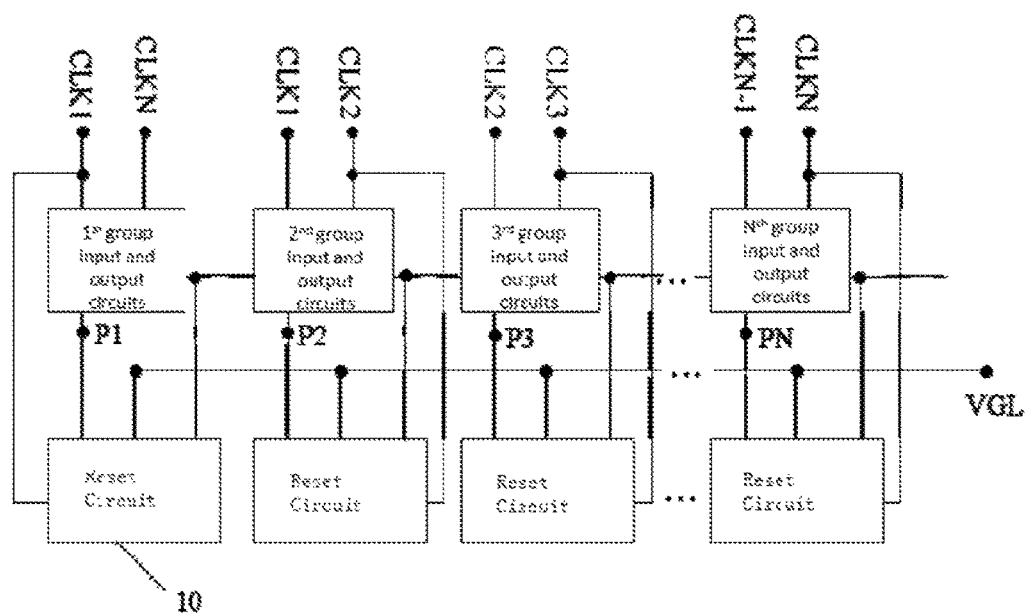
FIG. 1 is a schematic diagram of a structure of a gate integrated driving circuit according to one embodiment.

The present invention is described with reference to embodiments of the invention. Throughout the description of the invention reference is made to FIGS. 1-5. When referring to the figures, like structures and elements shown throughout are indicated with like reference numerals. The described embodiments are merely part of the present invention, and not all embodiments. All other embodiments obtained by those skilled in the art without departing from the inventive work are within the scope of the present invention.

Hereinafter, specific embodiments of an output reset circuit, a gate integrated driving circuit, a driving method, and a display apparatus provided in the embodiments of the present disclosure will be described in detail with reference to the accompanying drawings.

FIG. 1 shows a schematic diagram of a structure of a gate integrated driving circuit according to one embodiment. As shown in FIG. 1, the gate integrated driving circuit comprises a plurality of reset circuits 10 of the same structure. The total number of the reset circuits 10 is the same as that of clock signal terminals which are used for supplying clock signals to input and output circuits. The total number of the reset circuits 10 is at least three. The total number of the reset circuits may be 3, 4, 5, 6, 7, or more. The reset circuits may have the same or different structure. Preferably, the total number of the reset circuits is 3.

In one embodiment, a first terminal of a reset circuit 10 is coupled to a reference signal terminal VGL. A second terminal thereof is coupled to signal output terminals of a set of input and output circuits respectively. A third terminal thereof is coupled to control terminals of driving circuits of the set of input and output circuits respectively. A fourth terminal thereof is coupled to a clock signal terminal which is coupled to input terminal of the driving circuits of the set of input and output circuits respectively. The set of input and output circuits contains two or more input and output circuits. The set of input and output circuits may contain 2, 3, 4, 7, 9, 10, 11 or more input and output circuits. Each set of the input and output circuits may contain same or different numbers of input or output circuits.

Each reset circuit 10 is used for electrically coupling a reference signal terminal VGL to signal output terminals of a set of input and output circuits respectively under a control of the coupled clock signal terminal.

A clock signal terminal is coupled respectively to input terminals of driving circuits of a set of input and output circuits. For example, a first clock signal terminal CLK1 is coupled respectively to input terminals of driving circuits of the first set of the input and output circuits. Clock signal terminals coupled to input terminals of driving circuits of different sets of input and output circuits are loaded with different clock signals respectively, and there is overlapping portion between timing of every two of the different clock signals. Take the first and second sets of input and output circuits as examples, the clock signal terminal coupled to input terminals of driving circuits of the first set of input and output circuits is the first clock signal terminal CLK1. The clock signal terminal coupled to input terminals of driving circuits of the second set of input and output circuits is the second clock signal terminal CLK2. Furthermore, timing of the first clock signal of the first clock signal terminal CLK1 overlaps with timing of the second clock signal of the second clock signal terminal CLK2.

In one embodiment, the gate integrated driving circuit comprises N reset circuits 10 of the same structure. The total number of the reset circuits is the same as the total number of clock signal terminals which are used for supplying clock signals to the input and output circuits. N is an integer of at least three. Each of the reset circuits is used for electrically coupling the reference signal terminal VGL respectively to signal output terminals of a set of input and output circuits under a control of the coupled clock signal terminal. Each of the reset circuits is respectively coupled to output terminals of a set of input and output circuits, so that multiple input and output circuits share a reset circuit. Therefore, under a control of a clock signal terminal, each of the reset circuits is configured to output a reset signal of the reference signal terminal to output terminals of a set of input and output circuits coupled to the reset circuit in order to reset the output terminals. This prevents interference of other signals on the signal output terminals of the set of input and output circuits, thereby improving stability of input and output signals, simplifying structure of output reset terminals, and reducing occupied area and cost of the gate integrated driving circuit.

In one embodiment, the total number of the reset circuits and the total number of the clock signal terminals are both N. A second terminal of the n-th reset circuit is coupled respectively to signal output terminals of a set of input and output circuits of the (N*k+n)-th stages. N is an integer of at least 3. k represents a series of continuous integers from 0 to m, and N*m+N is a total number of the input and output circuits.

Figure 2:
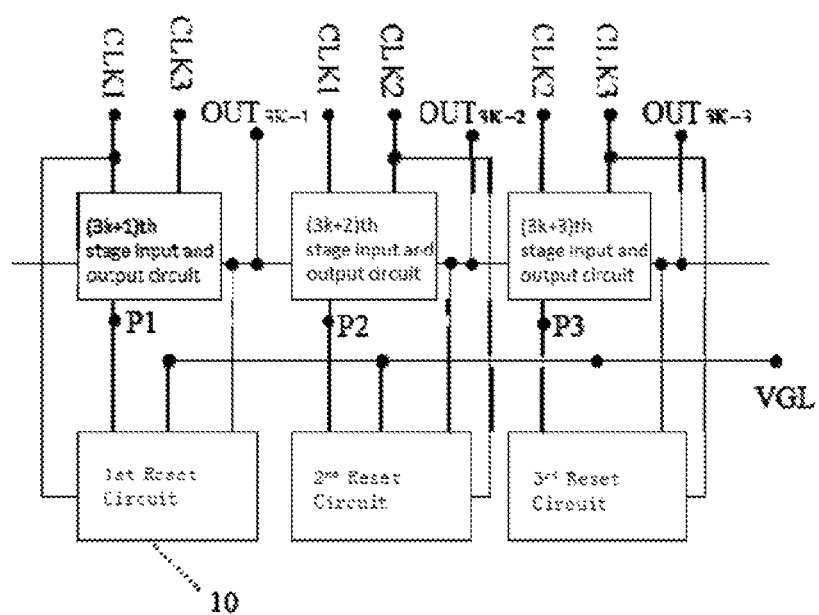
FIG. 2 is a schematic diagram of a gate integrated driving circuit according to one embodiment.

FIG. 2 shows a schematic diagram of a structure of a gate integrated driving circuit according to one embodiment. As shown in FIG. 2, both the total number of the reset circuits and the total number of the clock signal terminals are three. This not only ensures functionality of the output reset circuit but also significantly simplifies the gate integrated driving circuit.

In one embodiment, as shown in FIG. 1 and FIG. 2, a first terminal of each of the reset circuits 10 is coupled in series to a reference signal terminal VGL by a wire. As such, a plurality of the reset circuits 10 share one reference signal terminal VGL, and a reset signal of the reference signal terminal VGL may be outputted respectively to output terminals of the set of input and output circuits under a control of a coupled clock signal terminal. When the clock signal terminal outputs a high-level signal intermittently, signals outputted from output terminals of the set of input and output circuits are maintained at a low level. As such, the number of reference signal terminals VGL is reduced, thereby simplifying structure of the output reset terminals.

Figure 3:
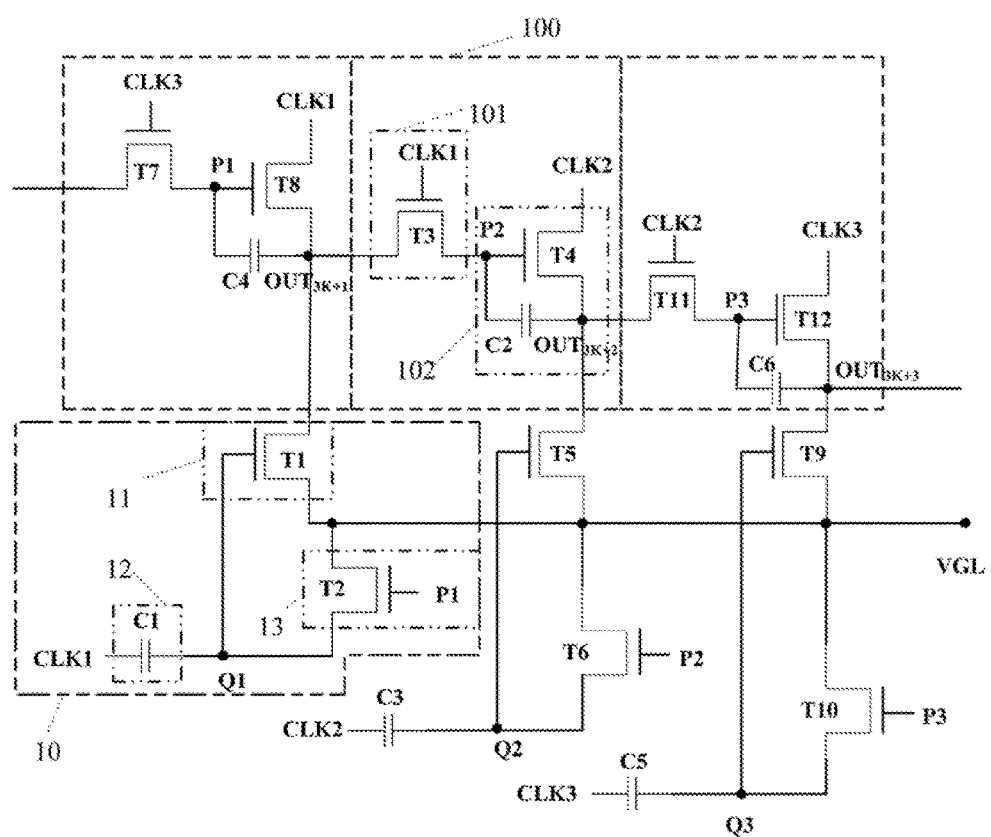
FIG. 3 is a schematic structural view of a gate integrated driving circuit according to one embodiment.

FIG. 3 shows a schematic structural view of a gate integrated driving circuit according to one embodiment. A specific structure of a gate integrated driving circuit which includes three reset circuits as shown in FIG. 2 and FIG. 3 is described. As shown in FIG. 3, the first reset circuit 10 includes a pull-down circuit 11, a potential holding circuit 12, and a pull-down control circuit 13.

In one embodiment, as shown in FIG. 3, a control terminal of the pull-down circuit 11 is coupled to a first node Q1. An input terminal thereof is coupled to the reference signal terminal VGL. An output terminal thereof is coupled to a signal output terminal $OUT_{3K+1}$ of the input and output circuit of the 3K+1th stage. The pull-down circuit 11 is used for electrically coupling the reference signal terminal VGL to the signal output terminal OUT$_{3K+1}$ of the input and output circuit under a control of a potential of the first node Q1. That is, when the first node Q1 inputs a valid signal, the pull-down circuit 11 is in an ON state, and outputs a reset signal of the reference signal terminal VGL to the signal output terminal OUT$_{3K+1}$ of the input and output circuit to reset the signal output terminal OUT$_{3K+1}$ of the input and output circuit.

In one embodiment, as shown in FIG. 3, a first terminal of the potential control circuit 12 is coupled to the first node Q1. A second terminal thereof is coupled to the first clock signal terminal CLK1.

In one embodiment, as shown in FIG. 3, a control terminal of the pull-down control circuit 13 is coupled to a control terminal P1 of a driving circuit of the input and output circuit of the 3K+1th stage. An input terminal thereof is coupled to the reference signal terminal VGL. An output terminal thereof is coupled to the first node Q1. The pull-down control circuit 13 is used for controlling the potential of the first node Q1 through the first clock signal terminal CLK1 coupled to the potential control circuit 12 and the reference signal terminal VGL under a control of a potential of the control terminal P1 of the driving circuit of the input and output circuit of the 3K+1th stage. That is, when the control terminal P1 of the driving circuit of the input and output circuit of the 3K+1th stage is inputted a valid signal, the pull-down control circuit 13 is in an ON state, and outputs a reset signal of the reference signal terminal VGL to the first node Q1. The potential of the first, node Q1 is maintained due to action of the potential control circuit 12.

In one embodiment, the pull-down circuit 11 includes a first thin film transistor T1. A gate of the first thin film transistor T1 is coupled so the first node Q1. A source thereof is coupled to the signal output terminal OUT$_{3K+1}$ of the input and output circuit of the 3K+1th stage. A drain thereof is coupled to the reference signal terminal VGL.

As shown in FIG. 3, the first thin film transistor T1 may be a P-type thin film transistor or an N-type thin film transistor, and it is not limited here. When the first thin film transistor T1 is a P-type thin film transistor and the signal inputted from the first node Q1 is a low level signal, the first thin film transistor T1 is turned on to output the reset signal of the reference signal terminal VGL to the signal output terminal OUT$_{3K+1}$ of the input and output circuit. When the first thin film transistor T1 is a N-type thin film transistor and the signal inputted from the first node Q1 is a high level signal, the first thin film transistor T1 is turned on to output the reset signal of the reference signal terminal VGL to the signal output terminal OUT$_{3K+1}$ of the input and output circuit.

Specific structure of the pull-down circuit 11 is not limited to the above-described structure provided by the embodiment. It may be others known by those skilled in the art and is not repeated here.

In one embodiment, the potential holding circuit 12 includes a first capacitor C1. A first terminal of the first capacitor C1 is coupled to the first node Q1 and a second terminal thereof is coupled to the first clock signal terminal CLK1.

In one embodiment, the pull-down control circuit 13 includes a second thin film transistor T2. A gate of the second thin film transistor T2 is coupled to the control terminal P1 of the driving circuit of the input and output circuit. A source thereof is coupled to the reference signal terminal VGL. A drain thereof is coupled to the first node Q1.

As shown in FIG. 3, the second thin film transistor T2 may be a P-type thin film transistor or an N-type thin film transistor, and is not limited here. When the second thin film transistor T2 is a P-type thin film transistor and the signal inputted from the control terminal P1 of the driving circuit of the input and output circuit is a low level signal, the second thin film transistor T2 is turned on and outputs the reset signal of the reference signal terminal VGL to the first node Q1. When the second thin film transistor T2 is a N-type thin film transistor and the signal inputted from the control terminal P1 of the driving circuit of the input and output circuit is a high level signal, the second thin film transistor T2 is turned on and outputs the reset signal of the reference signal terminal VGL to the first node Q1.

Specific structure of the pull-down circuit 13 is not limited to the above-described structure provided by the embodiment. It may be others known by those skilled in the art and is not repeated here.

Figure 4:
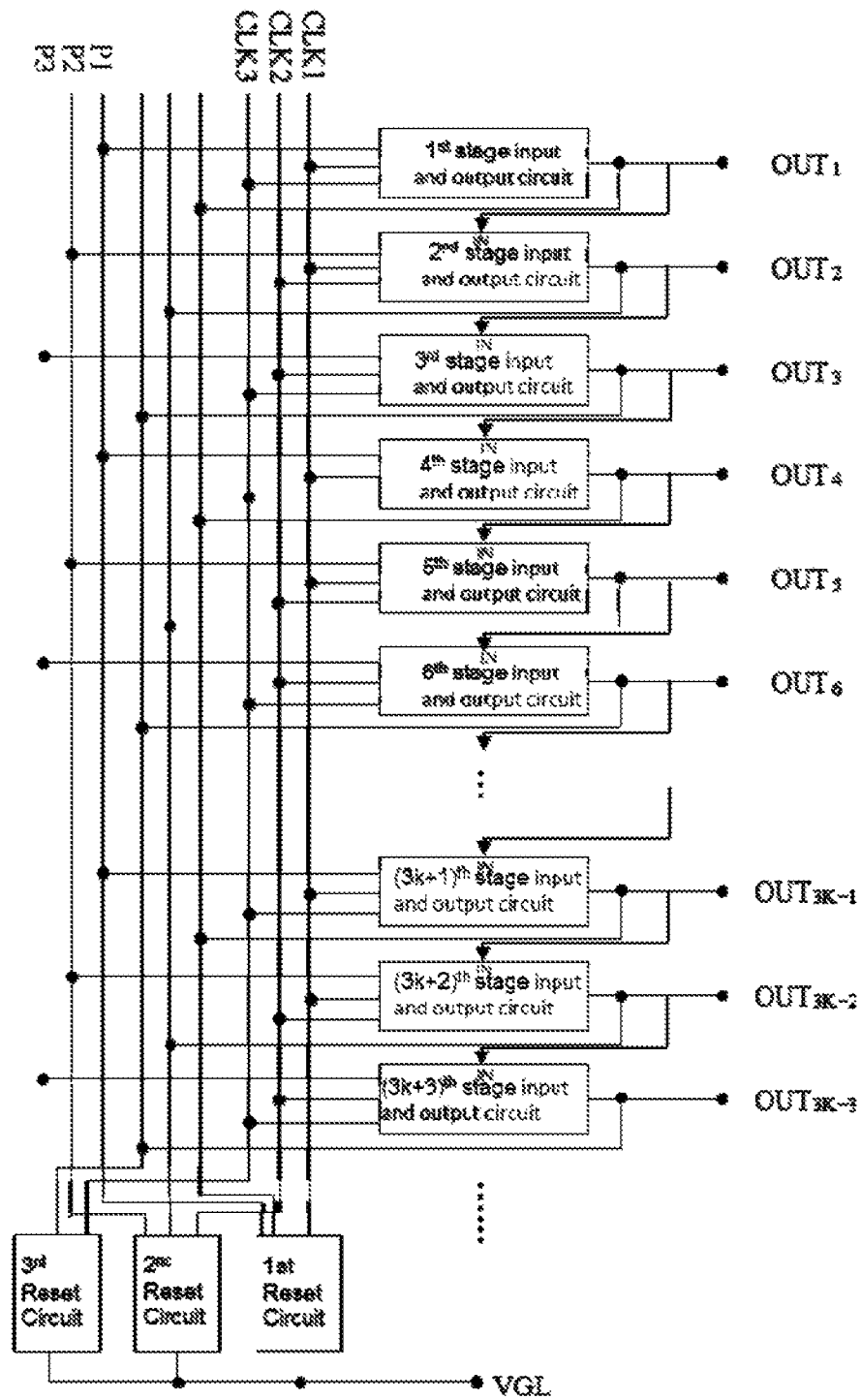
FIG. 4 is a schematic diagram of a gate integrated driving circuit according to one embodiment.

Another example of the present disclosure is a gate integrated driving circuit. FIG. 4 is a schematic diagram of a gate integrated driving circuit according to one embodiment. As shown in FIG. 4, the gate integrated driving circuit includes the output reset circuit according to one embodiment of the present disclosure and a plurality of input and output circuits coupled in series. Except an input and output circuit of last-stage, a signal output terminal of each of remaining input and output circuits is configured to input a valid pulse signal to a signal input terminal of a input and output circuit of next stage.

In one embodiment, as shown in FIG. 3, the input and output circuit 100 comprises an input circuit 101 and a driving circuit 102.

In this embodiment, a control terminal of the input circuit 101 is coupled to the first clock signal terminal CLK1. An input terminal thereof is coupled to the signal output terminal OUT$_{3K+1}$. An output terminal thereof is coupled to the control terminal P2 of the driving circuit 102. The input circuit 101 is used for transmitting a valid pulse signal inputted from the signal input terminal OUT$_{3K+1}$ to the control terminal P2 of the driving circuit 102 under a control of the first clock signal of the first clock signal terminal CLK1. That is, when the first clock signal terminal CLK1 is inputted a valid signal, the input circuit 101 is in an ON state, and outputs the effective pulse signal inputted from the signal input terminal OUT$_{3K+1}$ to the control terminal P2 of the driving circuit 102 to adjust a potential of the control terminal P2.

An input terminal of the driving circuit 102 is coupled to a second clock signal terminal CLK2 and an output terminal thereof is coupled to the signal output terminal OUT$_{3K+2}$ of the input and output circuit of the 3K+2 stage. The driving circuit 102 is used for outputting a second clock signal of the second clock signal terminal CLK2 to the signal output terminal OUT$_{3K+2}$ under a control of the effective pulse signal. In a repetition period, an effective pulse of the first clock signal is earlier than an effective pulse of the second clock signal. That is, when the control terminal of the driving circuit 102 is inputted an effective pulse signal, the driving circuit 102 is in an ON state and outputs the second clock signal of the second clock signal terminal CLK2 to the signal output terminal OUT$_{3K+2}$ to control the potential of the signal output terminal OUT$_{3K+2}$.

In one embodiment, as shown in FIG. 3, the input circuit 101 includes a third thin film transistor T3. A gate of the third thin film transistor T3 is coupled to the first clock signal CLK1, a source thereof is coupled so the signal input terminal $OUT_{3K+1}$, and a drain thereof is coupled to the control terminal P2 of the driving circuit 102.

As shown in FIG. 3, the third thin film transistor T3 may be a P-type thin film transistor or an N-type thin film transistor, and is not limited here. When the third thin film transistor T3 is a P-type thin film transistor and the signal inputted from the first clock signal CLK1 is a low level signal, the third thin film transistor T3 is turned on and outputs the effective pulse signal of the signal input terminal $OUT_{3K+1}$ to the control terminal P2 of the driving circuit 102. When the third thin film transistor T3 is a N-type thin film transistor and the signal inputted from the first clock signal CLK1 is a high level signal, the third thin film transistor T3 is turned on and outputs the effective pulse signal of the signal input terminal $OUT_{3K+1}$ to the control terminal P2 of the driving circuit 102.

Specific structure of the input circuit 101 of the input and output circuit 100 is not limited to the above-described structure provided by the embodiment. It may be others known by those skilled in the art and is not repeated here.

In one embodiment, as shown in FIG. 3, the driving circuit 102 includes a fourth thin film transistor T4 and a second capacitor C2. In this embodiment, a gate of the fourth thin film transistor T4 is coupled to the output terminal of the input circuit 101. A source thereof is coupled to the second clock signal terminal CLK2. A drain thereof is coupled to the signal output terminal $OUT_{3K+2}$. The second capacitor C2 is coupled between a gate and a drain of the fourth thin film transistor T4.

In one embodiment, as shown in FIG. 3, the fourth thin film transistor T4 may be a P-type thin film transistor or an N-type thin film transistor, and is not limited here. When the fourth thin film transistor T4 is a P-type thin film transistor and the signal inputted from the output terminal of the input circuit 101 is a low level signal, the fourth thin film transistor T4 is turned on and outputs the second clock signal of the second clock signal terminal CLK2 to the signal output terminal $OUT_{3K+2}$. When the fourth thin film transistor T4 is a N-type thin film transistor and the signal inputted from the output terminal of the input circuit 101 is a high level signal, the fourth thin film transistor T4 is turned on and outputs the second clock signal of the second clock signal terminal CLK2 to the signal output terminal $OUT_{3K+2}$.

Specific structure of the driving circuit 102 of the input and output circuit 100 is not limited to the above-described structure provided by the embodiment. It may be others known by those skilled in the art and is not repeated here.

FIG. 4 shows a gate integrated driving circuit according to one embodiment. The gate integrated driving circuit comprises a plurality of input and output circuits including an input and output circuit of the first stage, an input and output circuit of the second stage, an input and output circuit of the third stage, an input and output circuit the fourth stage, an input and output circuit of the fifth stage, an input and output circuit of the sixth stage, and an input and output circuit of the (3K+1)-th stage, an input and output circuit of the (3K+2)-th stage, and an input and output circuit of the (3K+3)-th stage. A signal output terminal of an input and output circuit of each stage inputs a valid pulse signal to a signal input terminal of an input and output circuit of the next stage.

Specifically, specific structure of each of the other input and output circuits in the gate integrated driving circuit is the same as that of the input and output circuit of the present disclosure, and is not repeated.

An operation of the gate integrated driving circuit according to one embodiment is described below with reference to the output reset circuit shown in FIG. 3 and the signal timing chart shown in FIG. 5.

Figure 5:
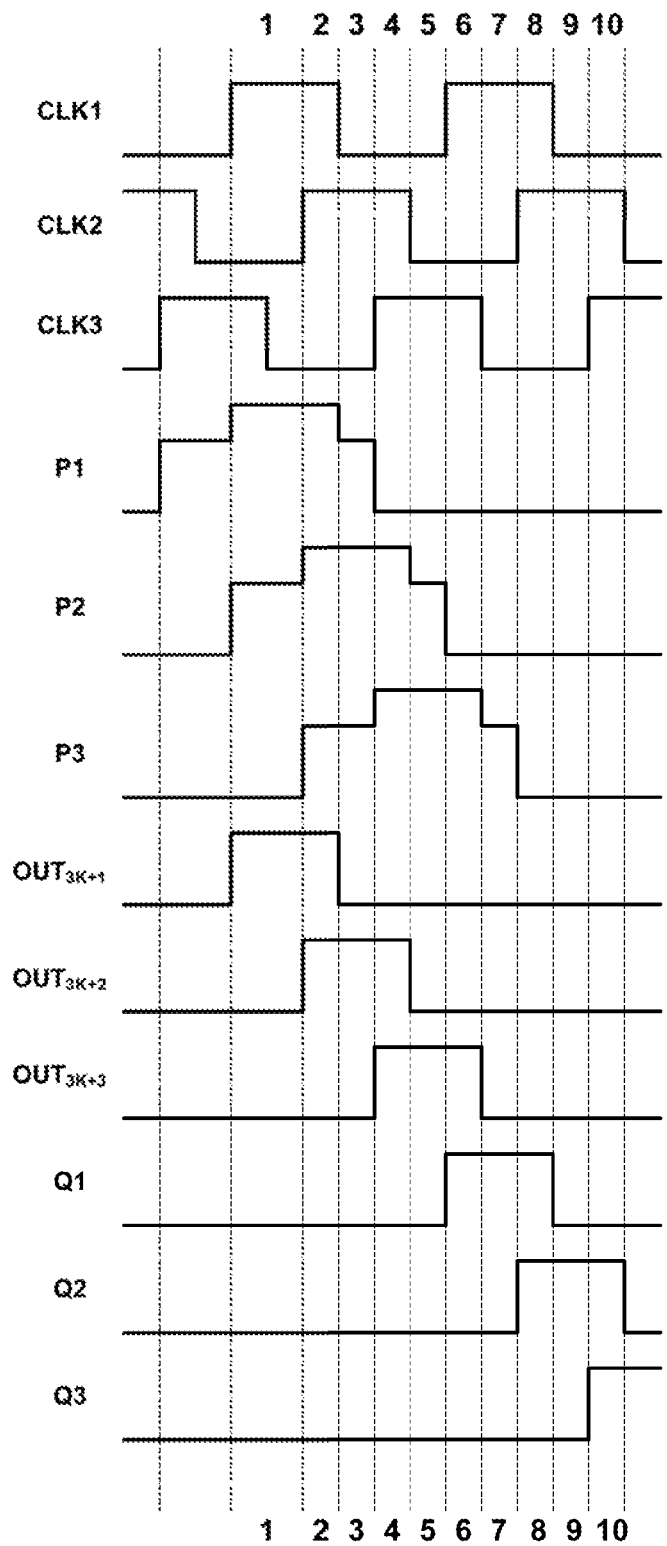
FIG. 5 is a signal timing diagram of a gate integrated driving circuit according to one embodiment.

FIG. 5 shows a signal timing chart of the gate integrated driving circuit according to one embodiment. As shown in FIG. 5, eight phases, t1-t8, are illustrated. In the following description, 1 indicates a high level signal and 0 indicates a low level signal.

In the t1 phase, CLK1=1, CLK2=0, the third clock signal CLK3 of a first half is 1 and a second, half thereof is 0, and $OUT_{3K+1}$=1. When CLK3=1, the seventh thin film transistor T7 turned on. As such, a high level signal at an output terminal of an input and output circuit of the previous stage is inputted to the control terminal P1, and P1 is pulled high to a high level. As the CLK3 changes from 1 to 0, the seventh thin film transistor T7 is turned off and the control terminal P1 remains at the high level. Since CLK1=1, the third thin film transistor T3 is turned on and the control terminal P2 is pulled high to a high level so that the fourth thin film transistor T4 is turned on. Furthermore, since CLK2=0, an output terminal $OUT_{3K+2}$ of the input and output circuit outputs a low level. At the same time, since the control terminal P2 is pulled high to the high level, the sixth thin film transistor T6 is turned on to transmit the low level signal of the reference signal terminal VGL to the second node Q2. The second node Q2 is kept at a low level.

In the t2 phase, CLK1=1, CLK2=1, CLK3=0, and $OUT_{3K+1}$=1. Comparing to the t1 phase, in this phase, the second clock signal terminal CLK2 changes from a low level to a high level. Since the control terminal P2 is at a high level, the fourth thin film transistor T4 is turned on to output the high level of the second clock signal terminal CLK2 to the output terminal $OUT_{3K+2}$ of the input and output circuit. As such, the output terminal $OUT_{3K+2}$ of the input and output circuit outputs a high level signal. At the same time, the potential of the control terminal P2 is further pulled high due to bootstrap effect of the capacitor C2. Therefore, this phase is an open phase of the output terminal $OUT_{3K+2}$ of the input and output circuit. In addition, since the output terminal $OUT_{3K+2}$ outputs a high level and CLK2=1, the eleventh thin film transistor T11 is turned on. As such, the control terminal P3 is pulled high to a high level. As a result, the twelfth thin film transistor T12 is turned on. Furthermore, since CLK3=0, the output terminal $OUT_{3K+3}$ of the input and output circuit outputs a low level signal. Furthermore, since the control terminal P3 is pulled high to the high level, the tenth thin film transistor T10 is turned on to transmit the low level of the reference signal terminal VGL to the third node Q3. As such, the third node Q3 is always kept a low level.

In the t3 phase, CLK1=0, CLK2=1, and CLK3=0. At this phase, since the first clock signal CLK1 goes from the high level to the low level and the control terminal P1 remains at the high level the eighth thin film transistor T8 remains on and the output terminal $OUT_{3K+1}$ is pulled low to a low level. Under action of the capacitor C4, the control terminal P1 is returned to the normal high level. Since the potential levels of the second clock signal terminal CLK2 and the third clock signal terminal CLK3 at this phase are the same as those in the t2 phase, the states of the output terminals $OUT_{3K+2}$ and $OUT_{3K+3}$ of the input and output circuit and the states of the control terminals P2 and P3 are the same as those in the t2 phase. In short, since the first clock signal CLK1 goes from the high level to the low level, the potential of output terminal $OUT_{3K+1}$ of the input and output circuit becomes low. As such, the potential of the control terminal P1 falls to the normal level. Therefore, when the eighth thin film transistor T8 remains on, the potential of the first clock signal terminal CLK1 determines the potential of the output terminal $OUT_{3K+1}$ of the input and output circuit. At the same time, due to the action of the capacitor C4, the potential of the control terminal P1 is changed.

In the t4 phase, CLK1=0, CLK2=1, and CLK3=1. Since the states of the first clock signal terminal CLK1 and the second clock signal terminal CLK2 at this phase are the same as those in the t3 phase, the output terminals $OUT_{3K+1}$ and $OUT_{3K+2}$ keep a low level and a high level respectively. In short, since the state of the second clock signal CLK2 from t2 to t4 phase does not change and the control terminal P2 remains high at the t2-t4 phase, the output terminal $OUT_{3K+2}$ in the t2-t4 phase outputs a high level signal. In addition, comparing to the t3 phase, the third clock signal terminal CLK3 is changed to a high level in the t4 phase. In addition, since the control terminal P3 is at a high level in the t2 and t3 phases, the twelfth thin film transistor T12 is kept open. As such, the potential of the output terminal $OUT_{3K+3}$ is pulled high and outputs a high level. At the same time, the potential of the control terminal P3 is further pulled up by the action of the capacitor C6. Therefore, this phase is an open phase of the output terminal $OUT_{3K+3}$.

In the t5 phase, CLK1=0, CLK2=0, and CLK3=1. The second clock signal terminal CLK2 is changed from the high level to the low level. The fourth thin film transistor T4 is turned on. As such, the low level signal of the second clock signal terminal CLK2 is outputted to the output terminal $OUT_{3K+2}$ so that the potential of the output terminal $OUT_{3K+2}$ is pulled low to a low level. The potential of the control terminal P2 is pulled low to the normal high level due to bootstrap effect of the capacitor C2. Therefore, at this phase, the potential of the output terminal $OUT_{3K+2}$ decreases as the second clock signal terminal CLK2 is changed from the high level to the low level.

In the t6 phase, CLK1=1, CLK2=0, and CLK3=1. The first clock signal CLK1 is changed from the low level to the high level, the third thin film transistor T3 is turned on, and the output terminal $OUT_{3K+1}$ pulls the potential of the control terminal P2 to the low level. At the same time, since the first clock signal terminal CLK1 goes from the low level to the high level, the first clock signal CLK1 continues to charge the capacitor C1. As such, the potential of the first node Q1 is pulled high to a high level. The control terminal P1 remains at a low level. The second thin film transistor T2 remains turned off. The first thin film transistor T1 is turned on. As such, the reset signal of the reference signal terminal VGL is outputted to the input and output circuit output terminal $OUT_{3K+1}$ to reset the output terminal $OUT_{3K+1}$, thereby preventing interference of other signals. Therefore, this phase can be referred to as a reset phase of the output terminal $OUT_{3K+1}$.

In the t7 phase, CLK1=1, CLK2=0, and CLK3=0. Since the control terminal P3 is always at the high level and the twelfth thin film transistor T12 remains open, the third clock signal terminal CLK3 is changed from the high level to the low level. As a result, the output terminal $OUT_{3K+3}$ outputs a low level signal. At the same time, because the output terminal $OUT_{3K+3}$ outputs a low level and under action of bootstrap effect of the capacitor C6, the signal level of the control terminal P3 is pulled lower and returns to a normal high level. Therefore, the potential of the output terminal $OUT_{3K+3}$ decreases as the potential of the third clock signal terminal CLK3 decreases.

In the t8 phase, CLK1=1, CLK2=1, and CLK3=0. Similarly as in the t6 phase, since the potential of the second clock signal terminal CLK2 is changed from the low level to the high level, the eleventh thin film transistor T11 is turned on, and the output terminal $OUT_{3K+2}$ pulls lower the potential of the control terminal P3. At the same time since the potential of the second clock signal terminal CLK2 is changed high from the low level to the high level, the second clock signal CLK2 continues to charge the capacitor C3 so that the potential of the second node Q2 is pulled higher to a high level. Furthermore, the control terminal P2 is kept at a low level, the sixth thin film transistor T6 remains closed, and the fifth thin film transistor T5 is turned on. As such, the reset signal of the reference signal terminal VGL is transmitted to the input and output circuit output terminal $OUT_{3K+2}$, and resets the output terminal $OUT_{3K+2}$, thereby preventing interference of other signals. Therefore, this phase can be referred to as a reset phase of the input and output circuit output terminal $OUT_{3K+2}$.

In the t9 phase, CLK1=0, CLK2=1, and CLK3=0. At this phase, since the potential of the first clock signal CLK1 is changed from the high level to the low level, the charging for the capacitor C1 is stopped so that the potential of the first node Q1 is pulled lower to a low level. As such, the first thin film transistor T1 is turned off to stop outputting the reset signal of the reference signal terminal VGL to the output terminal $OUT_{3K+1}$.

In the t10 phase, CLK1=0, CLK2=1, and CLK3=1. Similarly as in the t6 and t8 phases, since the potential of the third clock signal terminal CLK3 is changed from the low level to the high level, the third clock signal terminal CLK3 continues to charge the capacitor C5 which pulls the potential of the third node Q3 higher to a high level. Furthermore, the control terminal P3 is kept at a low level so that the tenth thin film transistor T10 is turned off. The ninth thin film transistor T9 is turned on so that the reset signal of the reference signal terminal VGL is transmitted to the input and output circuit output terminal $OUT_{3K+3}$ and resets the output terminal $OUT_{3K+3}$, thereby preventing interference of other signals. Therefore, this phase can be referred as the reset phase of the output terminal $OUT_{3K+3}$.

Thereafter, only when the potential of the third clock signal CLK3 is changed from the low level to the high level and the control terminal P3 is kept at a low level, the tenth thin film transistor T10 remains off, the ninth thin film transistor T9 is turned on so that the reset signal of the reference signal terminal VGL is transmitted to the input and output circuit output terminal $OUT_{3K+3}$ to reset the output terminal $OUT_{3K+3}$, thereby preventing interference of other signals.

In summary, for each of the reset circuits, as long as the clock signal terminal coupled to the reset circuit undergoes a high level and then a low level, the input and output circuit coupled to the reset circuit undergoes an open and then reset process. Therefore, the output terminals of the input and output circuits are constantly reset by the reset circuits, thereby improving stability of the input and output signals, simplifying structure of the reset output terminals, and reducing cost of the gate integrated driving circuit.

The above example is described with reference to the output reset circuit shown in FIG. 3. The gate integrated driving circuit provided by the embodiment of the present disclosure can be realized by providing reset circuits according to one embodiment of the present disclosure, and is not limited thereto.

Another example of the present disclosure is a display apparatus. The display apparatus includes the gate integrated driving circuit according to one embodiment of the present disclosure. The specific implementation can be referenced on the gate integrated driving circuit described above, and the same part is not repeated here.

Another example of the present disclosure is a driving method of the gate integrated driving circuit according to one embodiment of the present disclosure. In one embodiment, as shown in FIG. 3 and FIG. 5, a plurality of input and output circuits coupled in series to the reset circuits are divided into three sets. The driving method may include the following phases.

The first phase is the t1 phase. An effective pulse signal inputted from the first clock signal CLK1 is outputted to the signal output terminals $OUT_{3K+1}$ of the first set of input and output circuits under a control of the control terminals P1 of the driving circuits of the first set of input and output circuits. The pull-down control circuit of the reset circuit coupled to the signal output terminals $OUT_{3K+1}$ of the first set of input and output circuits is in an ON state. As such, the reference signal of the reference signal terminal VGL is outputted to the first node Q1 of the reset circuit, and pulled low the potential of the first node Q1. At the same time, the effective pulse signal inputted to the first clock signal CLK1 turned on the input circuits of the second set of input and output circuits. As a result, the gate driving scan signal outputted from the output terminals $OUT_{3K+1}$ of the first set of input and output circuits is outputted to the control terminals P2 of the driving circuits of the second set of input and output circuits. At the same time, the effective pulse signal inputted from the first clock signal terminal CLK1 charges the potential control circuits of the reset circuits coupled to the signal output terminals $OUT_{3K+1}$ of the first set of input and output circuits.

The second phase is the t2 phase. Under a control of the control terminals P2 of the driving circuits in the second set of input and output circuits, the effective pulse signal inputted front the second clock signal CLK2 is outputted to the signal output terminals $OUT_{3K+2}$ of the second set of the input and output circuits furthermore, the pull-down control circuit of the reset circuit coupled to the output terminals $OUT3_{K+2}$ of the second set of input and output circuits is in the ON state. As such, the reference signal of the reference signal terminal VGL is outputted to the second node Q2 of the reset unit, so that the potential of the second node Q2 is pulled low. At the same time, the effective pulse signal inputted to the second clock signal terminal CLK2 turns on the input circuits of the third set of input and output circuits. As a result, the gate driving scan signal outputted from the output terminals $OUT_{3K+}2$ of the second set of input and output circuit signals is outputted to the control terminals P3 of the driving circuit of the third set of input and output circuits, which is coupled to the output terminals $OUT_{3K+}2$ of the second set of the input and output circuits. At the same time, the effective pulse signal inputted to the second clock signal terminal CLK2 charges the potential control circuits of the reset circuit coupled to the signal output terminals $OUT_{3K+}2$ of the second set of the input and output circuits.

The third phase is the t3 phase. Under a control of the first clock signal CLK1, the signal output terminals $OUT_{3K+1}$ of the first set of the input and output circuits stops generating output, and the input circuits of the second set of the input and output circuits are in the OFF state.

The fourth phase is the t4 phase. Under a control of the control terminals P3 of the driving circuits of the third set of the input and output circuits, the effective pulse signal inputted from the third clock signal terminal CLK3 is outputted to the signal output terminals $OUT_{3K+3}$ of the third set of input and output circuits. Furthermore, the pull-down control circuit of the reset circuit coupled to the signal output terminals $OUT_{3K+3}$ of the third set of input and output circuits is in the ON state. As a result, the reference signal of the reference signal terminal VGL is outputted to the third node Q3 of the reset circuit, and the potential of the third node Q3 is pulled low. At the same time, the effective pulse signal inputted to the third clock signal terminal CLK3 turns on the input circuits of the first set of the input and output circuits. As a result, the gate driving scan signal outputted from the signal output terminal $OUT_{3K+3}$ of the third set of the input and output circuits is outputted to the control terminals P1 of the driving circuit of the first set of the input and output circuits coupled to the signal output terminal $OUT_{3K+3}$ of the third set of the input and output circuits. At the same time, the effective pulse signal inputted to the third clock signal CLK3 charges the potential control circuit of the reset circuit coupled to the signal output terminals $OUT_{3K+3}$ of the third set of the input and output circuits.

The fifth phase is the t5 phase. Under a control of the second clock signal CLK2, the signal output terminals $OUT_{3K+2}$ of the second set of the input and output circuits stop generating output, and the input circuits of the third set of the input and output circuits are in the OFF state.

The sixth phase is the t6 phase. Under a control of the first clock signal CLK1, the first clock signal terminal CLK1 charges the potential control circuit of the reset circuit coupled to the signal output terminals $OUT_{3K+1}$ of the first set of input and output circuits. The potential of the first node Q1 coupled to the potential control circuit of the reset circuit is pulled high. At the same time, the first node Q1 turns on the pull-down circuit of the reset circuit coupled to the signal output terminals $OUT_{3K+1}$ of the first set of the input and output circuits. As such, the reference signal of the reference signal terminal VGL is outputted to the signal output terminals $OUT_{3K+1}$ of the first set of the input and output circuits.

In one embodiment, the above-described driving method further includes:

The seventh phase is the t7 phase. Under a control of the third clock signal terminal CLK3, the signal output terminals $OUT_{3K+3}$ of the third set of input and output circuits stop generating output, and the input circuit of the first set of input and output circuits are in the OFF state.

The eighth phase is the t8 phase. Under a control of the second clock signal terminal CLK2, the second clock signal terminal CLK2 charges the potential control circuit of the reset circuit coupled to the signal output terminals $OUT_{3K+2}$ of the second set of the input and output circuits. As a result, the potential of the second node Q2 coupled to the potential control circuit of the reset circuit is pulled high. At the same time, the second node Q2 turns on the pull-down circuit of the reset circuit coupled to the signal output terminals $OUT_{3K+2}$ of the second set of the input and output circuits. As such, the reference signal of the reference signal terminal VGL is outputted to the signal output terminals $OUT_{3K+2}$ of the second set of the input and output circuits.

The ninth phase is the t9 phase. Under a control of the first clock signal CLK1, the first clock signal CLK1 stops charging the potential control circuit of the reset circuit coupled to the signal output terminals $OUT_{3K+1}$ of the first set of the input and output circuits. As a result, the potential of the first node Q1 coupled to the potential control circuit of the reset circuit is pulled low. At the same time, the first node Q1 turns off the pull-down circuit of the reset circuit coupled to the signal output terminals $OUT_{3K+1}$ of the first set of the input and output circuits.

The tenth phase is t10 phase. Under a control of the third clock signal terminal CLK3, the third clock signal terminal CLK3 charges the potential control circuit of the reset circuit coupled to the signal output terminals $OUT_{3K+3}$ of the third set of input and output circuits. The potential of the third node Q3 coupled to the potential control circuit of the reset circuit is pulled high. At the same time, the third node Q3 turns on the pull-down circuit of the reset circuit coupled to the signal output terminals $OUT_{3K+3}$ of the third set of input and output circuits. As a result, the reference signal of the reference signal terminal VGL is outputted to the signal output terminals $OUT_{3K+3}$ of the third set of input and output circuits. Therefore, the output terminals of three sets of input and output circuits are reset. This prevents interference of other signals on the output terminals of the three sets of input and output circuits, thereby improving stability of input and output signals, simplifying structure of the output reset terminals, and reducing occupied area and cost of the gate integrated driving circuit.

Examples of the present disclosure include an output reset circuit, a gate integrated driving circuit, a driving method and a display device. The gate integrated driving circuit includes a plurality of reset circuits having the same structure. The total number of the reset circuits is the same as the number of clock signal terminals which are used for supplying clock signals to the input and output circuits. The total number of the reset circuits is at least three. Each reset circuit is configured to electrically couple the reference signal terminal to the signal output terminals of the group of coupled input and output circuits under a control of the clock signal terminals. Each reset circuit is respectively coupled with output terminals of a set of input and output circuits, so that a plurality of input and output circuits share one reset circuit. Under the control of clock signal terminal, each reset circuit may control to output the reset signal of the reference signal terminal to the signal output terminals of a set of input and output circuits coupled to the reset circuit to have the output terminals reset. This prevents the interference of other signals on the output terminal of the set of the input and output circuits. It also improves stability of input and output signals, simplifies structure of the output reset terminals, and reduces occupied area and cost of the gate integrated driving circuit.

It will be apparent to those skilled in the art that various changes and modifications can be made in the present invention without departing from the spirit and scope of the present invention. Thus, it is intended that the present invention encompasses such modifications and variations if they come within the scope of the appended claims or the equivalents thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A gate integrated driving circuit comprising:
    N reset circuits,
    wherein for each of the N reset circuits, a first terminal thereof is coupled to a reference signal terminal, a second terminal thereof is coupled to signal output terminals of a set of input and output circuits respectively, a third terminal thereof is coupled to control terminals of driving circuits of the set of the input and output circuits respectively, and a fourth terminal thereof is coupled to a clock signal terminal coupled to input terminals of the driving circuits of the set of the input and output circuits respectively; and
    wherein N is an integer of at least 3 and the set of input and output circuits contains two or more input and output circuits, and
    wherein the N reset circuits comprise a m-th reset circuit, a second terminal of the m-th reset circuit is coupled to signal output terminals of a set of input and output circuits of the (N*k+m)-th stages respectively, and a third terminal of the m-th reset circuit is coupled to control terminals of driving circuits of the set of the input and output circuits of the (N*k+m)-th stages respectively, a fourth terminal of the m-th reset circuit is coupled to the m-th clock signal terminal which is coupled to input terminals of the driving circuits of the set of input and output circuits of the (N*k+m)-th stages respectively, wherein k represents a series of continuous integers from 0 to x and m is an integer within a range from 1 to N.

2. The gate integrated driving circuit according to claim 1, wherein each of the N reset circuits is configured to electrically connect the reference signal terminal to the signal output terminals of the set of input and output circuits respectively under a control of the clock signal terminal coupled to the input terminals of the driving circuits of the set of input and output circuits respectively.

3. The gate integrated driving circuit according to claim 1, wherein
    each of the N clock signal terminals coupled to input terminals of driving circuits of a set of input and output circuits respectively is inputted a clock signal, and different clock signal terminals are inputted with different clock signals respectively, wherein there is overlapping timing between each of the two clock signals.

4. The gate integrated driving circuit according to claim 3, wherein a time-delay is provided between each pair of adjacent clock signals sequentially from the first clock signal inputted at the first clock signal terminal to the N-th clock signal inputted at the N-th clock signal terminal.

5. The gate integrated driving circuit according to claim 4, the time-delay equals to 1/N of one period of a former clock signal of the pair of adjacent clock signals.

6. The gate integrated driving circuit according to claim 1, wherein each of the input and output circuits comprises an input circuit and a driving circuit,
    wherein a control terminal of the input circuit is coupled to a first clock signal terminal, an input terminal thereof is coupled to a signal input terminal, an output terminal thereof is coupled to a control terminal of the driving circuit, and the input circuit is configured to transmit an effective pulse signal inputted from the signal input terminal to the control terminal of the driving circuit under a control of a first clock signal of the first clock signal terminal; and
    an input terminal of the driving circuit is coupled to a second clock signal terminal, an output terminal thereof is coupled to a signal output terminal, and the driving circuit is configured to output a second clock signal inputted from the second clock signal terminal to the signal output terminal under a control of the effective pulse signal.

7. The gate integrated driving circuit according to claim 6, wherein
an effective pulse of the first clock signal is earlier than an effective pulse of the second clock signal during a repetition period.

8. The gate integrated driving circuit according to claim 6, wherein the input circuit comprises a third thin film transistor, a gate of the third thin film transistor is coupled to the first clock signal terminal, a source thereof is coupled to the signal input terminal, and a drain thereof is coupled to the control terminal of the driving circuit.

9. The gate integrated driving circuit according to claim 6, wherein, the driving circuit comprises a fourth thin film transistor and a second capacitor, wherein,
a gate of the fourth thin film transistor is coupled to the output terminal of the input circuit, a source thereof is coupled to the second clock signal terminal, and a drain thereof is coupled to the signal output terminal; and
the second capacitor is coupled between the gate and the drain of the fourth thin film transistor.

10. The gate integrated driving circuit according to claim 1, wherein N is 3.

11. The gate integrated driving circuit according to claim 1, wherein each of the N reset circuits includes a pull-down circuit, a potential holding circuit, and a pull-down control circuit, wherein:
a control terminal of the pull-down circuit is coupled to a first node, an input terminal thereof is coupled to the reference signal terminal, an output terminal thereof is coupled to a signal output terminal of an input and output circuit, and the pull-down circuit is configured to electrically connect the reference signal terminal to the signal output terminal of the input and output circuit under a control of a potential of the first node;
a first terminal of the potential control circuit is coupled to the first node and a second terminal thereof is coupled to a clock signal terminal; and
a control terminal of the pull-down control circuit is coupled to a control terminal of a driving circuit of the input and output circuit, an input terminal thereof is coupled to the reference signal terminal, an output terminal thereof is coupled to the first node, and the pull-down control circuit is configured to control the potential of the first node through the clock signal terminal coupled to the potential control circuit and the reference signal terminal under a control of a potential of the control terminal of the driving circuit of the input and output circuit.

12. The gate integrated driving circuit according to claim 11, wherein the pull-down circuit comprises a first thin film transistor, a gate of the first thin film transistor is coupled to the first node, a source thereof is coupled to the signal output terminal of the input and output circuit, and a drain thereof is coupled to the reference signal terminal.

13. The gate integrated driving circuit according to claim 11, wherein the potential holding circuit comprises a first capacitor, a first terminal of the first capacitor is coupled to the first node and a second terminal thereof is coupled to the clock signal terminal.

14. The gate integrated driving circuit according to claim 11, wherein the pull-down control circuit comprises a second thin film transistor, a gate of the second thin film transistor is coupled to the control terminal of the driving circuit in the input and output circuit, a source thereof is coupled to the reference signal terminal, and a drain thereof is coupled to the first node.

15. The gate integrated driving circuit according to claim 1, wherein except an input and output circuit of last stage, a signal output terminal of each of remaining input and output circuits is configured to input a valid pulse signal to a signal input terminal of an input and output circuit of next stage.

16. A display apparatus comprising the gate integrated driving circuit according to claim 1.

17. A driving method of the gate integrated driving circuit according to claim 1, wherein N=3, the driving method comprises:
in the first phase, applying an effective pulse signal to the first clock signal terminal;
in the second phase, applying an effective pulse signal to the second clock signal terminal,
in the third phase, stopping the effective pulse signal applied to the first clock signal terminal;
in the fourth phase, applying an effective pulse signal to the third clock signal terminal;
in the fifth phase, stopping the effective pulse signal applied to the second clock signal terminal; and
in the sixth phase, applying an effective pulse signal to the first clock sign terminal.

18. The driving method of the gate integrated driving circuit according to claim 17, wherein
in the first phase, an effective pulse signal inputted from the first clock signal terminal is outputted to the signal output terminal of the first set of input and output circuits under a control of the control terminal of the driving circuit in the first set of input and output circuits, the potential of the first node is pulled low, the gate driving scan signal outputted from the first set of input and output circuit signal outputs is outputted to the control terminal of the driving circuit in the second set of input and output circuits coupled to the first set of input and output circuit signal outputs, and, meanwhile, the potential control circuit of the reset circuit coupled to signal output terminals of the first set of input and output circuits being charged;
in the second phase, an effective pulse signal is outputted to the signal output terminal of the second set of input and output circuits, under a control of the control terminal of the driving circuit of the second set of input and output circuits, the potential of the second node is pulled low, the gate driving scan signal outputted from signal output terminals of the second set of input and output circuit is outputted to the control terminal of the driving circuit of the third set of input and output circuits which is coupled to the second set of the input and output circuit signal output terminals, the potential control circuit of the reset circuit coupled to signal output terminals of the first set of input and output circuits being charged,
in the third phase, the signal output terminals of the first set of the input and output circuits stop generating output, and the input circuits of the second set of the input and output circuits are in the off state;
in the fourth stage, an effective pulse signal is outputted to the signal output terminal of the third input and output circuit under the control of the terminal of the driving circuit of the third set of the input and output circuits, the potential of the third node is pulled low, the gate driving scan signal outputted from the signal output terminal of the third group input and output circuits is outputted to the control terminal of the driving module in the first set of the input and output circuits coupled to the signal output terminal of the third input and output circuit, and the potential control module of the reset circuit coupled to the signal output terminal of the third set of the input and output circuits is charged;

in the fifth stage, the signal outputs of the second set of the input and output circuits stops generating output, and the input circuit of the third set of the input and output circuits being in the off state; and in the sixth stage, the reference signal of the reference signal terminal is outputted to the signal output terminal of the first set of the input and output circuits.

19. The driving method of the gate integrated driving circuit according to claim 17, wherein the driving method further comprises in the seventh phase, stopping the effective pulse signal applied to the third clock signal terminal;

in the eighth phase, applying an effective pulse signal to the second clock signal terminal;

in the ninth phase, stopping the effective pulse signal applied to the first clock signal terminal; and in the tenth phase, applying an effective pulse signal to the third clock signal terminal.

20. The driving method of the gate integrated driving circuit according to claim 19, wherein in the seventh phase, output terminals of the third set of input and output circuits stops generating output, and the input circuit of the first set of input and output circuits is in the off state;

in the eighth phase, the reference signal of the reference signal terminal is outputted to the signal output terminal of the second input and output circuit;

in the ninth phase, the pull-down circuit of the reset circuit coupled to the first set of input and output circuit signal output terminals is in the off state; and in the tenth phase, the reference signal of the reference signal terminal is output to the signal output terminal of the third input and output circuit.

* * * * *